United States Patent [19]

Veneklasen et al.

[11] Patent Number: 4,695,773
[45] Date of Patent: Sep. 22, 1987

[54] FIELD EMISSION GUN ELECTRODE GEOMETRY FOR IMPROVED FOCUS STABILITY

[75] Inventors: Lee H. Veneklasen, Castro Valley; Guy G. Yagunoff, San Francisco, both of Calif.

[73] Assignee: The Perkin-Elmer Corporation, Norwalk, Conn.

[21] Appl. No.: 600,246

[22] Filed: Apr. 16, 1984

Related U.S. Application Data

[63] Continuation-in-part of Ser. No. 332,275, Dec. 18, 1981, abandoned, which is a continuation of Ser. No. 132,673, Mar. 21, 1980, abandoned.

[51] Int. Cl.$^4$ .................. H01J 29/58; H01J 29/52
[52] U.S. Cl. ..................... 315/382; 315/383
[58] Field of Search ............. 315/382, 383, 382.1; 250/311; 313/448, 447

[56] References Cited

U.S. PATENT DOCUMENTS

| | | | |
|---|---|---|---|
| 3,046,442 | 7/1962 | Cook | 315/382 |
| 3,275,867 | 9/1966 | Tsuchimoto | 250/311 |
| 3,890,533 | 6/1975 | Tanaka | 315/382 |
| 4,274,035 | 6/1981 | Fukuhara et al. | 250/311 |
| 4,467,243 | 8/1984 | Fukushima et al. | 313/448 |

Primary Examiner—Theodore M. Blum
Assistant Examiner—Gregory C. Issing
Attorney, Agent, or Firm—Thomas P. Murphy; Edwin T. Grimms; Francis L. Massell

[57] ABSTRACT

In field emission systems having beam current regulation by use of modulating field strengths from a control or Wehnelt electrode adjacent the emission electrode, the varying field strengths produce a focus instability of the emitted beam. By the precise spacing of the emission tip, Wehnelt electrode and first accelerating electrode, and by the precise aperture diameters of the Wehnelt and first accelerating electrodes, the beam focus remains stabilized for modulating field strength variations.

4 Claims, 3 Drawing Figures

4,695,773

FIELD EMISSION GUN ELECTRODE GEOMETRY FOR IMPROVED FOCUS STABILITY

CROSS REFERENCE TO RELATED APPLICATIONS

This application is a continuation-in-part of application Ser. No. 332,275 filed Dec. 18, 1981 which was a continuation of application Ser. No. 132,673 filed Mar. 21, 1980, both now abandoned.

This application is related to U.S. Pat. No. 4,337,422 granted to Lee H. Veneklasen entitled "Field Emission Gun with Noise Compensation". This patent describes and claims an improved beam current regulating system employing a Wehnelt electrode for modulating the electric field strength at the emission source.

BACKGROUND OF THE INVENTION

This invention relates to field emission guns employing an emission source, an apertured beam accelerating electrode and a Wehnelt or control electrode in the vicinity of the source and responsive to regulation signals for modulating the field emission from the source. The invention relates specifically to the geometry of the field emission triode comprising the emission source, Wehnelt electrode, and accelerating electrode and to the precise dimensions required to produce a stabilized focus as the regulation signal is continuously being varied in polarity and amplitude to maintain a constant beam current.

In field emission beam current compensation systems employing the above mentioned triode elements, the continuously varying field strength in the vicinity of the emission source affects the emitted beam to produce an undesirable shifting in the axial position of the virtual emission source as the regulation signal to the Wehnelt is varied. This shifting effect results in an instability of the focus of the beam and tends to diminish in value the advantages obtained by the beam noise compensation system.

Focus instability in the triode regions of field emission gun system are well recognized and treatises on the problem have been published by J. R. A. Cleaver in the "International Journal of Electronics", Volume 38, No. 4, at Pages 531–540, and also by S. Nomura et al in the "IRTRI Proceedings" (1973) at Page 35. S. Nomura et al was also granted a U.S. Pat. No. 3,925,706, which describes a beam compensation system employing triode elements in which the accelerating electrode is provided with a novel semispherical surface for improving the electron optical characteristics of the system. This approach, as well as other known prior art devices developed for improving the electron optical characteristics in field emission systems, having relied on the theory that there were three variables that must be properly coordinated to obtain the desired improvement. These variables are (1) the spacing between the accelerating electrode and the Wehnelt or control electrode, (2) the spacing between the emission source and accelerating electrode, and (3) the aperture diameter in the Wehnelt electrode. While proper selection of these three dimensions will greatly improve beam focus stability in the field of emission guns, there remains a considerable amount of focus instability so that the virtual source of the beam, as viewed from outside of the emitting region, appears to shift along the beam axis as the continuously varying regulation signal is applied to the Wehnelt electrode.

We had discovered that for precise beam focus stability, an important fourth variable, the diameter of the aperture in the accelerating electrode, must be accurately selected. Thus the invention is for a field emission triode structure which, when viewed from outside of the emitting region, appears to have a non-shifting virtual emission source irrespective of continuously varying regulation signals applied to the Wehnelt electrode. This non-shifting virtual source is achieved by the proper selection of the dimensions for (1) the spacing between the accelerating electrode and the Wehnelt electrode, (2) the spacing between the emission source and the accelerating electrode, (3) the aperture diameter of the Wehnelt electrode, and (4) the diameter of the aperture in the accelerating electrode.

DESCRIPTION OF THE FIGURES

In the drawings which illustrate the preferred embodiment of the invention.

DETAILED DESCRIPTION

Figure 1:
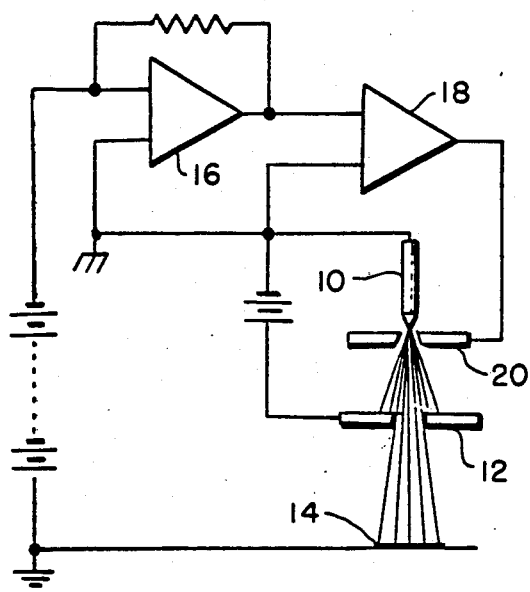
FIG. 1 is a simplified schematic diagram of a typical field emission gun having beam compensation and employing the emission triode elements.

FIG. 1 is a simplified schematic diagram of a field current emission gun employing a cathode emission source 10 which is contained in a high vacuum chamber (not shown) so that it readily emits a beam of electrons toward an accelerating anode electrode 12 that is maintained at a constant positive potential with respect to the local ground reference of the cathode 10. The accelerating electrode 12 contains a coaxial aperture through which a portion of the electron beam is accelerated to a specimen 14 that is preferably maintained at earth ground potential and at a very high positive potential with respect to the local ground reference of the cathode 10.

The actual beam current being used to bombard the sample 14 is measured by a current-to-voltage converter 16, the output of which is compared at the comparator 18 with a fixed D.C. reference signal (not shown) and the output of the comparator 18 is applied to the Wehnelt electrode 20 to vary the field strength in the tip area of the cathode 10 and to thereby vary and regulate the emission from the cathode 10. The Wehnelt electrode 20 therefore receives regulation signals from the comparator 18 that vary both in amplitude and in polarity.

Figure 2:
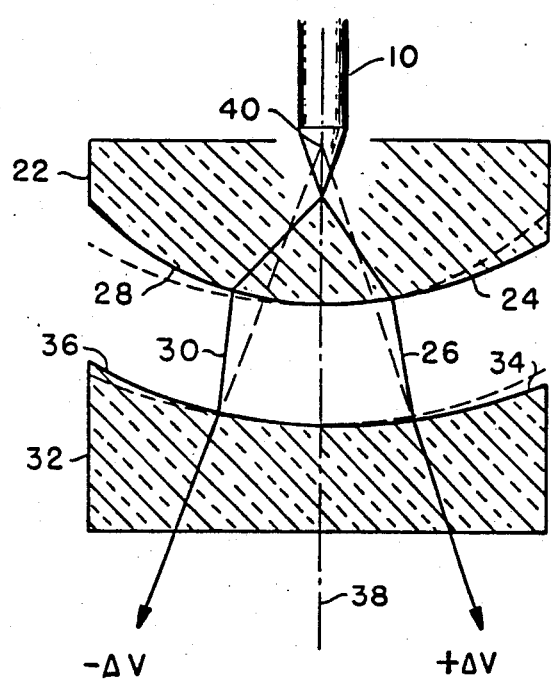
FIG. 2 is a sectional schematic diagram of an equivalent optical system which is included herein for an explanation of the problem of focus stability.

FIG. 2 is a sectional elevation view of an optical equivalent of the emission from the tip of a cathode 10, and is presented herein to explain the problem that results in focus instability of the emitted beam. Illustrated in FIG. 2 is the pointed cathode 10 of FIG. 1 illustrated within a convex lens 22 which represents the field produced by the presence of the Wehnelt 20. The modulating regulation voltage from the comparator 18 of FIG. 1 causes a variation in the field which has the effect of varying the convergence of the lens 22. If the regulating signal from comparator 18 is positive with respect to its zero norm, the field strength of the cathode increases causing greater emission current so that electrons are more attracted to the positive Wehnelt electrode 20 of FIG. 1 to therefore cause the beam from this lens region to appear as though it originated closer to the actual cathode; that is, the cathode lens region becomes less convergent as illustrated by the arcuate section 24 of lens 22. The electron beam path resulting from this positive regulating voltage therefore appears to follow the optical beam 26 in FIG. 2. If, on the other hand, the regulating signal from the comparator 18 is negative with respect to its norm, it tends to repel electrons from the Wehnelt and resuts in a more convergent lens section 28 and an electron beam represented by the optical beam 30.

The concave lens 32 of FIG. 2 represents the effect of the first anode or accelerating electrode 12 of FIG. 1 and if the effects of this electrode are temporarily neglected, it is apparent that the electron beam represented by the optical beam 26 resulting from the positive regulating signal, and the beam 30 resulting from the negative regulating signal at the Wehnelt electrode 20 will appear to originate from different axial positions, and will thereby display a focus instability of the system.

The concave lens 32 of FIG. 2 represents the effect of the accelerating electrode 12 of FIG. 1 which, with respect to the cathode emission source 10, is at a positive potential, thereby attracting electrons to produce a divergence of the electron beams. This lens 32 also varies in its divergence since a higher positive potential appearing on the Wehnelt electrode 20 will result in a reduction of the electric field between the Wehnelt and the first anode 12 and therefore a weaker field transition at the first anode aperture. Thus, a voltage on the Wehnelt electrode that is positive with respect to its norm will produce a lens effect indicated by the arcuate surface 34 and a negative going regulating signal is represented by the arcuate section 36 of the lens 32. If lenses 22 and 32 are properly spaced so that the varying regulating signal applied to the Wehnelt lens varies the divergence and convergence of each lens by appropriate amounts, the beams emitted from the triode structure would be symmetrical about the axis 38 of the triode structure and with all converge at a fixed point 40 in the cathode emission source 10 that is the virtual emission source of the field emission gun. That is, only with a proper geometry of the triode elements will there result a non-movable or fixed virtual source of electrons from the gun irrespective of amplitude or polarity variations in the regulating signal generated by the comparator 18 of FIG. 1 and applied to the Wehnelt electrode 20.

As mentioned previously we have found that the proper geometry of the triode elements depends upon four variable factors, to wit: the spacing between the cathode emission source 10 and the surface of the first anode or accelerating electrode 12, the spacing between the Wehnelt electrode 20 and the accelerating electrode 12, the diameter of the aperture in the Wehnelt electrode 20, and also the diameter of the aperture in the accelerating electrode 12. The proper selection of dimensions of these parameters results in the precise balance of strengths of each of the lenses 22 and 32 that is necessary to establish a non-movable or fixed positioned virtual emission source 40 and hence a focus stability of the system.

Figure 3:
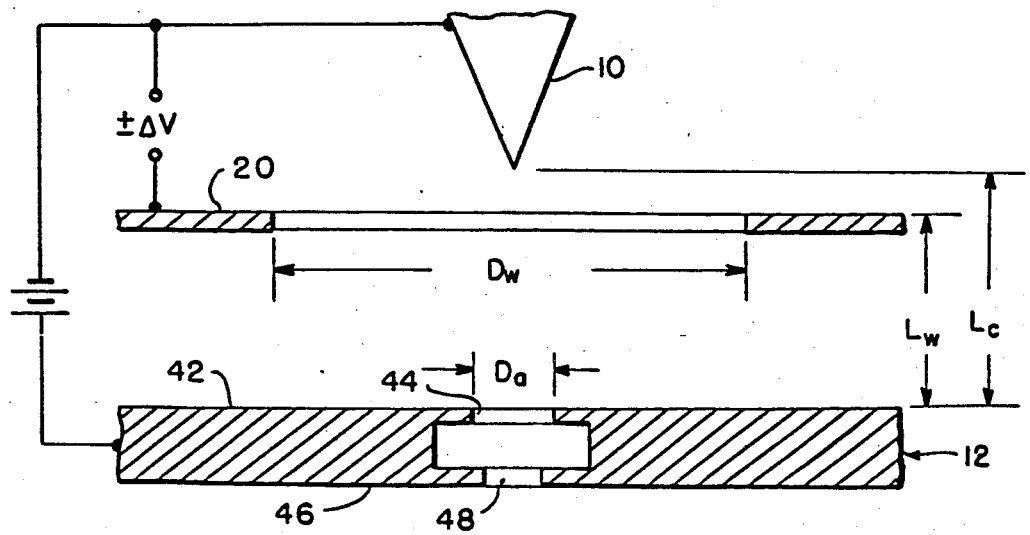
FIG. 3 is a sectional elevation view illustrating in greater detail the triode element structure of the field emission gun of FIG. 1.

FIG. 3 is a sectional elevation view illustrating in greater detail the field emission triode elements including the cathode 10, first anode or accelerating electrode 12 and the Wehnelt or control electrode 20. As previously discussed, the first anode 12 is maintained at a positive potential with respect to the local ground reference of the cathode 10. The Wehnelt electrode 12 is at a potential that varies in polarity and amplitude according to the regulation signal output of the comparator 18 of FIG. 1 and the Wehnelt electrode 20 has a central aperture having a diameter indicated in FIG. 3 as $D_w$. First anode 12 is parallel with the Wehnelt 20 and also contains through its top surface 42 an annular axial aperture 44 having a diameter of $D_a$. Coaxial and communicating with the aperture 44, and in the bottom surface 46 of the anode 12, is a beam limiting aperture 48, the diameter of which has no effect upon the field distribution or focal properties of the triode emitting region and which may be selected according to the beam current requirements of the optical system in which the gun is applied.

As illustrated in FIG. 3, the top surface 42 of the anode 12 is spaced from the emission tip of the cathode 10 by a distance designated as $L_c$ and from the top surface of the thin Wehnelt electrode 20 by a distance designated as $L_w$. All four of these dimensions, $D_w$, $D_a$, $L_c$, and $L_w$, must be properly selected to provide the precise balance necessary for a stable virtual source, as prevously described. In the triode illustrated in FIG. 3 the cathode-to-anode spacing, $L_c$, and the anode aperture diameter, $D_a$, are critical parameters and the inclusion of this latter parameter, $D_a$, is the essential distinction between our invention and the prior art. By very extensive calculations and experimental ray tracing using axial potential distributions obtained for many different combinations of dimensions, we have determined that the dimensions necessary to obtain a stationary virtual emission source 40 of FIG. 2 and therefore focus stability of the system, can be:

$D_w = 3.0$ mm
$D_a = 300$ microns
$L_c = 1.0$–$1.3$ mm
$L_w = 1.9$ mm

A typical diameter of the beam limiting aperture 48 may be in the order of 100 microns and the anode 12 may have a thickness in the order of approximately 1.8 mm. As previously mentioned, these latter two dimensions are not critical to the focus stability of the system. It will be further noted that in this example, the value of $L_w$ is greater than that of $L_c$, a part of the emission tip of the cathode 10 extends through the aperture in the Wehnelt 20.

The following section will describe the methods used by the inventors to arrive at the relationships among $D_w$, $L_c$, $L_w$ and $D_a$ in order to achieve focus stability. While there are doubtless several algorithms that would lead to the desired relationships, it is claimed that, without the specific exploitation of $D_a$ in the computations, the computations would not converge yield the desired focus stability.

The first step of the computation is to limit the variables $D_w$, $L_c$ and $L_w$ to a range that will obtain emission from the cathode. Since the emission properties of the field emission diode ($D_w \rightarrow \infty$) are experimentally known, one uses this configuration as a baseline to compare later results. Using a relaxation method program, the field strength at a surface near the cathode for the case of $L_c = 1.3$ mm, was calculated varying $L_w$ and $D_w$ to obtain a three dimensional plot of anode potential V necessary for emission. For these calculations, it was assumed that the Wehnelt potential $\Delta V$ was zero. In the course of the computation, it was noted that the field strength was essentially independent of anode diameter, so that, while it is important in achieving optical stability, it can be chosen essentially independent of $L_c$, $L_w$, and $D_w$ for purposes of insuring emission.

The data curves for $L_w$ at $D_w = \infty$ can be used to calibrate the computations with known field emission diode voltages. This is necessary because the precise size and shape of the cathode cannot directly be modeled by the electrostatic field computation. In this case, we allowed all values of $L_w$ and $D_w$ where the anode voltage V was no more than 1.5 kV above its nominal 5 kV value.

The next step is to insure that the range of $L_w$ and $D_w$ also allow sufficient control upon the emission. By varying $\Delta V$ and recording the resulting change in field strength near the cathode, one may define a range of $D_w$ and $L_w$ whereby in our case there is a $\pm 20\%$ range in cathode emission. The sensitivity of emission depends upon the exponential relationship between emission and field strength. Further analysis was thus restricted to realistic values of $D_w$ and $L_w$.

The next step in the optimization directly addresses the problem of focus stability. Recognizing that the anode diameter $D_a$ controls the focal properties of the diverging lens 32, the computation proceeds by determining the exact electrostatic potential distribution and its derivatives along the axis of the electrostatic system in FIG. 3. For this calculation, values of $L_c$, $L_w$, and $D_w$ are chosen within the ranges established above, based on emission and control sensitivity criteria, while $D_a$ is treated as a variable to minimize the dependence of net lens effect with variations in $\Delta V$. Knowing the potential distribution, a standard ray tracing program is used to determine the path (26, 30 in FIG. 2) of electrons through the system. The position 40 of the virtual emission source is plotted graphically as $Z_f$ versus $\Delta V$ for each value of $D_a$. The slope $dz_f/d(\Delta V)$ represents the movement of the focus while varying emission. By plotting the slope $dz_f/d(\Delta V)$ versus aperture diameter $D_a$, one may choose $D_a$ such that the slope, and thus the defocus sensitivity is zero. Whether the slope exhibits a local minimum or a local zero depends upon the choice of $L_w$ and $D_w$ as well as $D_a$, so the computation tends to be iterative.

The key to this computation is to establish a functional relationship among cathode emission and geometric parameters $L_c$, $L_w$, $D_w$ so as to restrict the design to practical limits of V and $\Delta V$, and then to analyze the optical properties using all four parameters $L_c$, $L_w$, $D_w$ and $D_a$. Due to the complexity of the problem, both relationships are necessarily based on computer results and cannot be expressed as mathematical formulas. The essence of the description in this case is the algorithm and choice of parameters used to solve the problem, and not the specific solution given above.

The preferred embodiment of the invention has been described in connection with a field emission gun producing a flow of electrons from a cathode at a local ground reference through a first anode and thence to a sample which is preferably at earth ground reference several thousand volts positive with respect to the local ground reference of the cathode. It will be appreciated that by appropriate reversal of power source polarities, the field emission gun may be used for the production of positive ions. In this configuration, the triode elements described hereinbefore will perform similarly to that described in connection with the electron gun.

Having thus described our invention, what is claimed is:

1. A field emission gun having a coaxial triode electron beam forming structure including:
    an electron emission source;
    an accelerating anode having a first axial aperture therethrough, said first aperture having a diameter, $D_a$, the spacing between said emission source and the proximate surface of said accelerating anode having the dimension, $L_c$; and
    a Wehnelt electrode between said emission source and said accelerating anode, said Wehnelt having an axial aperture of a diameter, $D_w$, said Wehnelt being responsive to variable beam regulation signals for correspondingly varying the field strength of said emission source to produce a cathode lens effect, and also varying the emission from said source, said Wehnelt being parallel with and spaced from the proximate surface of said accelerating anode by a distance, $L_w$, and producing an electric field with an associated anode lens effect;
    the dimensions for said $D_a$, $L_c$, $D_w$ and $L_w$ being selected in relationship to each other to provide focus stability to said field emission gun irrespective of variations in said beam regulation signals, by the placement of said Wehnelt electrode such that electric potential changes on said Wehnelt electrode produce a precise balance of each of said lens associated with said cathode emission source and said anode so that no axial shift in position of the image of said emission source results.

2. The field emission gun claimed in claim 1 wherein said dimensions for focus stability are substantially equal to: $D_a = 300$ microns, $L_c = 1.0$ to 1.3 mm, $D_w = 3.0$ mm and $L_w = 1.9$ mm.

3. The field emission gun claimed in claims 1 or 2 wherein said first aperture in said accelerating anode extends through the surface of said anode proximate said emisssion source, and wherein the surface of said anode opposite said proximate surface is provided with a second aperture that is coaxial with said first aperture and communicates therewith, said second aperture having a diameter selected to suitably limit the diameter of the electron beam emerging from said accelerating anode.

4. The field emission gun claimed in claim 3 wherein the electrical polarities of said gun are reversed whereby said gun emits an ion beam.

* * * * *